(12) United States Patent
Hwang

(10) Patent No.: US 6,416,361 B1
(45) Date of Patent: Jul. 9, 2002

(54) SMALL FORM-FACTOR PLUGGABLE TRANSCEIVER CAGE

(75) Inventor: Jeng-Yih Hwang, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/991,591

(22) Filed: Nov. 16, 2001

(51) Int. Cl.[7] ............................................. H01R 13/648
(52) U.S. Cl. ........................ 439/607; 439/939; 174/51; 361/818
(58) Field of Search .............................. 174/51, 59, 60, 174/6, 35 C, 135, 40 CC, 78; 439/98, 92, 100; 361/799, 753, 818, 816

(56) References Cited

U.S. PATENT DOCUMENTS

| | | | | |
|---|---|---|---|---|
| 5,879,173 A | * | 3/1999 | Poplawski et al. | 439/607 X |
| 6,118,071 A | * | 9/2000 | Munch et al. | 174/51 |
| 6,155,878 A | * | 12/2000 | Chen | 439/607 |
| 6,329,592 B1 | * | 12/2001 | Auclair | 174/40 CC X |
| 6,335,869 B1 | * | 1/2002 | Branch et al. | 361/816 |

* cited by examiner

Primary Examiner—Dean A. Reichard
Assistant Examiner—Dhiru R Patel
(74) Attorney, Agent, or Firm—Wei Te Chung

(57) ABSTRACT

An SFP cage includes two sidewalls, a sidewall cover, a top plate, a bottom wall and a rear cover. The cage is preferably made from a single piece of metal plate. A plurality of spring tabs is formed on the top plate and each sidewall. Each spring tab has an inward and an outward grounding portion. The inward grounding portions project into the cage for contacting an SFP module. The inward an outward grounding portions cooperate to provide multiple grounding paths and prevent EMI. A plurality of compliant legs, needle eye legs and support legs depends from the sidewalls. The compliant and needle eye legs are extended through a PCB, and prevent the cage from moving during solder reflowing. The support legs abut a face of the PCB. The support legs serve as standoffs, separating the cage from the PCB to facilitate accurate soldering.

14 Claims, 6 Drawing Sheets

SMALL FORM-FACTOR PLUGGABLE TRANSCEIVER CAGE

BACKGROUND OF THE INVENTION

1. Field of the Invention

The present invention relates to an optical transceiver cage, and more particularly to a small form-factor pluggable (SFP) transceiver cage of a high data transfer rate program gigabit interface converter (GBIC).

2. Description of the Related Art

Transceiver modules provide bidirectional transmission of data between an electrical interface and an optical data link. The module receives electrically encoded data signals and converts them into optical signals which are then transmitted over the optical data link. The module also receives optically encoded data signals, converts them into electrical signals, and transmits the electrical signals to the electrical interface.

Normally, the transceiver module is mounted on a printed circuit board (PCB) assembly of a host computer, an input/output system, a peripheral device, or a switch. An SFP transceiver module connects with a metal cage assembly mounted on the PCB. The metal cage generally has two parallel sidewalls, a rectangular top, a rectangular bottom, and front and rear ends. The metal cage provides easy interconnection, and is easily installed on the PCB. The cage functions to dissipate electrostatic buildup, and serves as an electromagnetic shield.

A conventional cage forms legs for supporting the cage on the PCB, and a plurality of outwardly projecting grounding tabs adjacent an entrance of the cage for engaging with a grounding chassis. However, there are no structures specifically for ground contacting a housing of an SFP transceiver module which is secured in the cage. The case does not provide adequate protection for the connecting interface from electromagnetic interference (EMI). In addition, there is no board locking mechanism to safeguard reflowing of solder during soldering of the cage to the PCB. The cage is liable to disengage from the PCB, causing poor soldering.

SUMMARY OF THE INVENTION

Accordingly, an object of the present invention is to provide an SFP transceiver cage which has a plurality of outward and inward grounding spring tabs to facilitate grounding and prevent EMI.

Another object of the present invention is to provide an SFP transceiver cage having legs that enable the cage to be locked on a PCB during soldering of the cage to the PCB.

A further object of the present invention is to provide a sturdy one-piece SFP transceiver cage that is easily and inexpensively made from a single metal plate.

To achieve the above objects, an SFP cage in accordance with a preferred embodiment of the present invention comprises two sidewalls, a sidewall cover, a top plate, a bottom wall and a rear cover. The cage is preferably made from a single piece of metal plate. A plurality of spring tabs is formed on the top plate and each sidewall. Each spring tab has an inward grounding portion and an outward grounding portion. The inward grounding portions project into a central cavity of the cage for contacting a housing of an SFP module secured in the cage. The inward grounding portions cooperate with the outward grounding portions to provide multiple grounding paths and prevent EMI. A plurality of compliant legs, needle eye legs and support legs depends from the sidewalls. The compliant and needle eye legs are extended through corresponding holes defined in a PCB. The compliant and needle eye legs prevent the cage from moving relative to the PCB during the course of solder reflowing. The support legs abut a face of the PCB. The support legs serve as standoffs, separating the cage from the PCB to facilitate accurate soldering.

Other objects, advantages and novel features of the present invention will be apparent from the following detailed description of preferred embodiments thereof with reference to the attached drawings, in which:

DETAILED DESCRIPTION OF THE PREFERRED EMBODIMENTS

Figure 1:
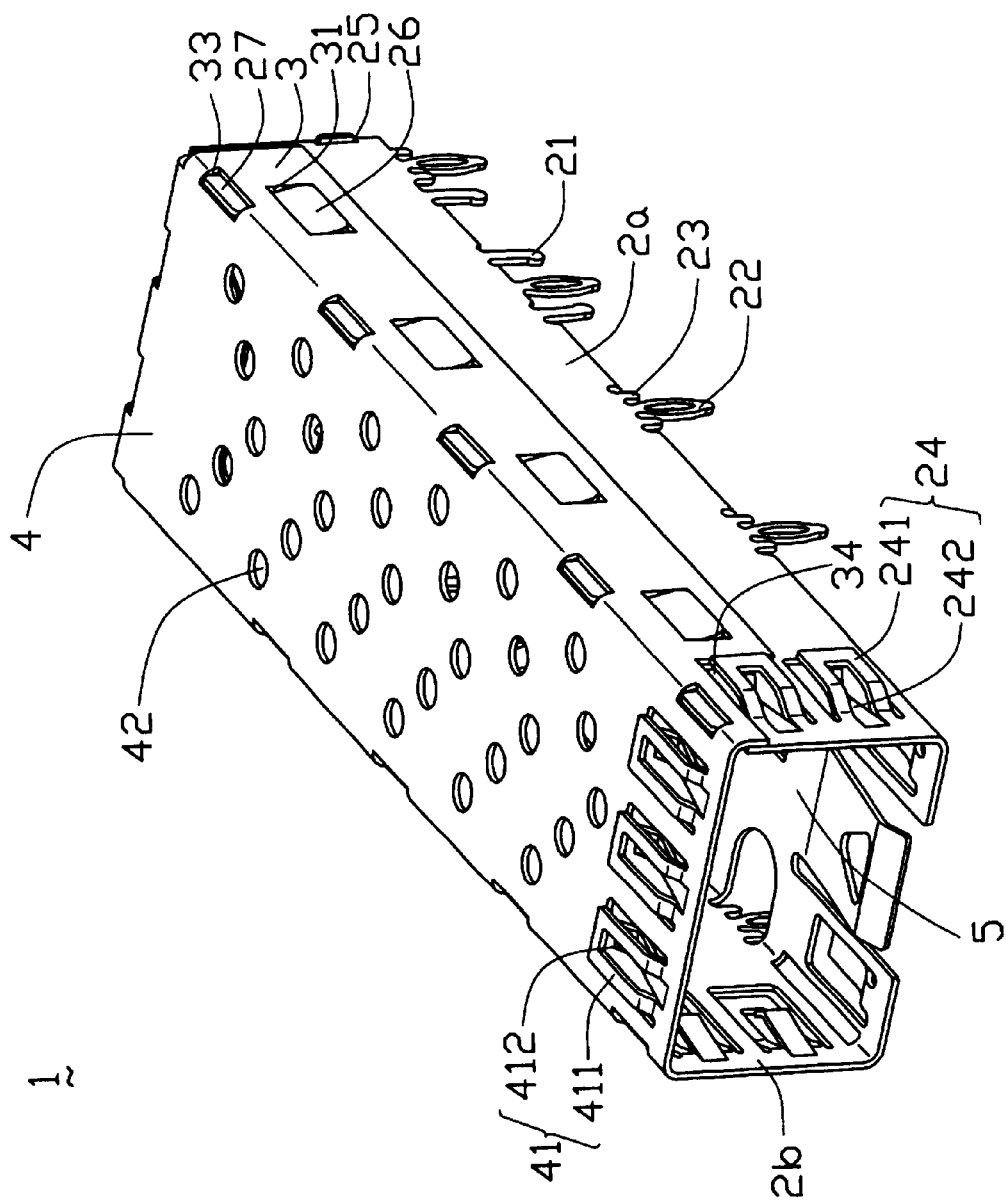
FIG. 1 is a perspective view of an SFP transceiver cage in accordance with a preferred embodiment of the present invention.
Figure 2:
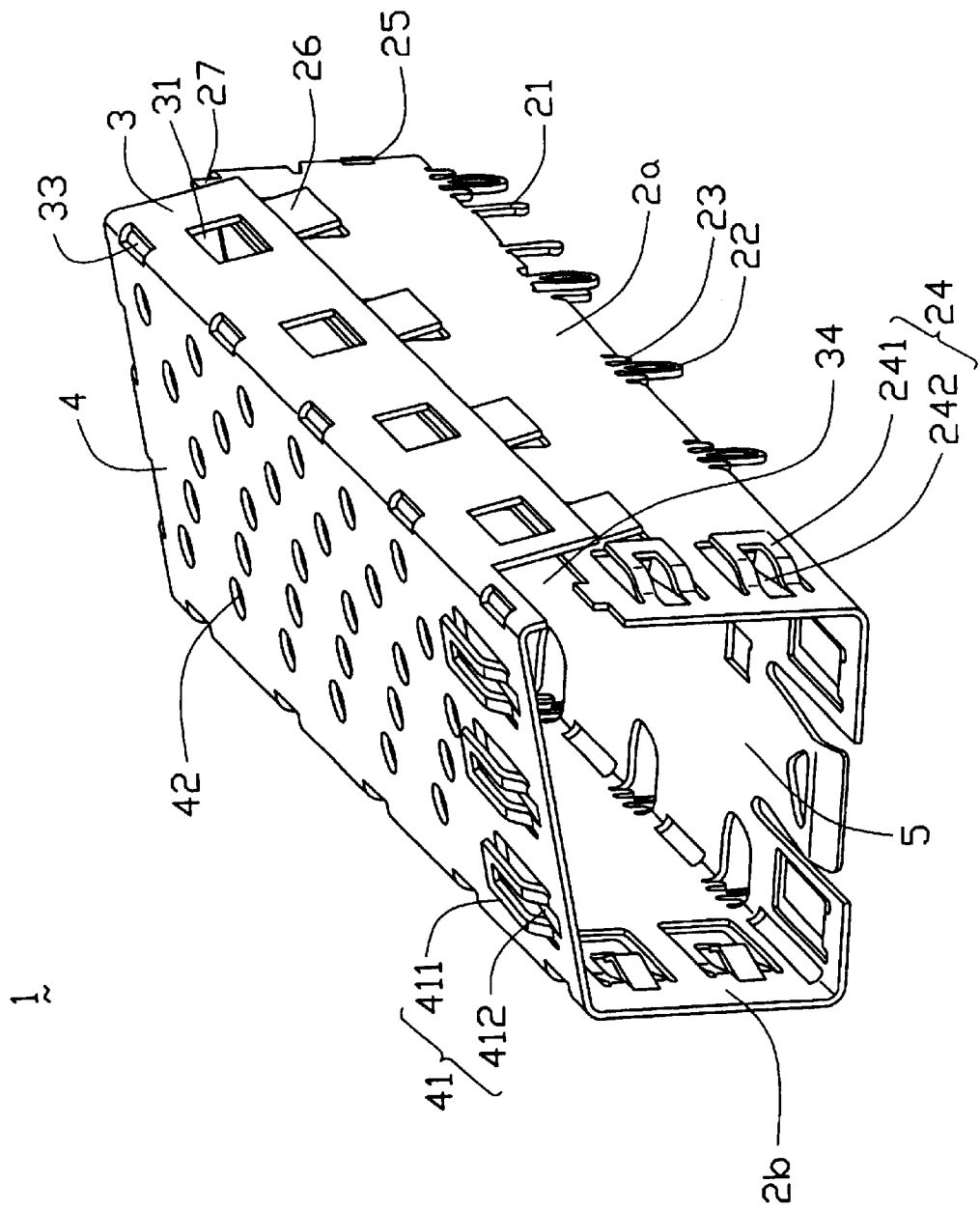
FIG. 2 is similar to FIG. 1, but showing the cage prior to assembly thereof.
Figure 3:
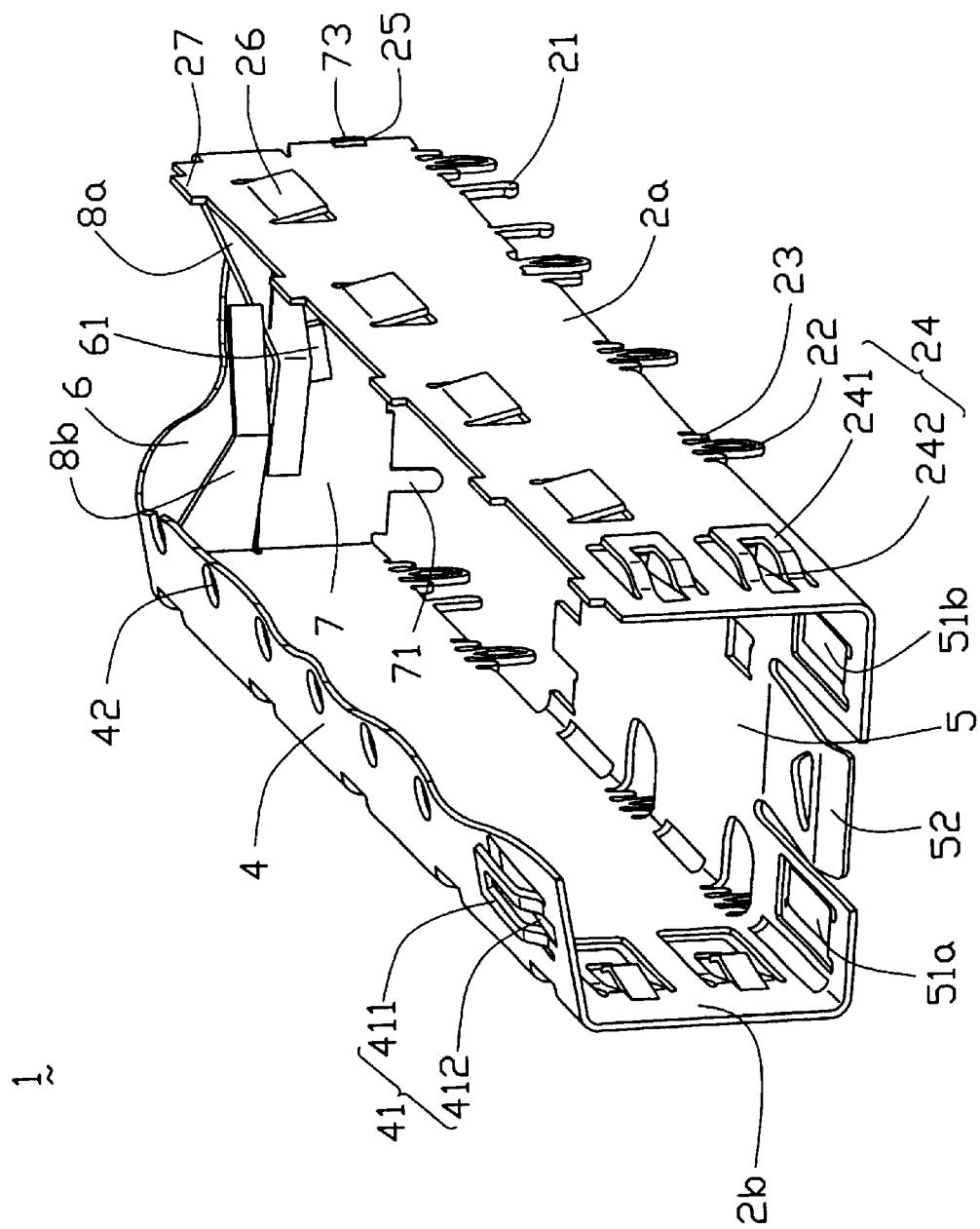
FIG. 3 is similar to FIG. 2, but with a portion of the cage cut away for clarity.

Referring to FIGS. 1–3, a small form-factor pluggable (SFP) transceiver cage 1 in accordance with a preferred embodiment of the present invention comprises a first sidewall 2a, a second sidewall 2b, a sidewall cover 3, a top plate 4, a bottom wall 5, a rear cover, and two spring arms 8a, 8b. The rear cover includes an outer panel 6 and an inner panel 7. The cage 1 is generally parallelepiped, and preferably made from a single piece of blank material such as a metal plate. The cage 1 may alternatively be made from two pieces of blank material.

Each sidewall 2a, 2b forms two grounding spring tabs 24 proximate a front end thereof and a plurality of compliant legs 21, needle eye legs 22 and support legs 23 depending from a lower edge thereof. Each spring tab 24 has an outward grounding portion 241, and an inward grounding portion 242. The first sidewall 2a also forms a plurality of resilient clasps 26 along an upper portion thereof, and a plurality of locating tabs 27 along a top edge thereof. A notch 25 is defined in a rear edge of the first sidewall 2a. The spring arms 8a, 8b inwardly extend generally perpendicularly from rear edges of the first and second sidewalls 2a, 2b respectively.

Figure 5:
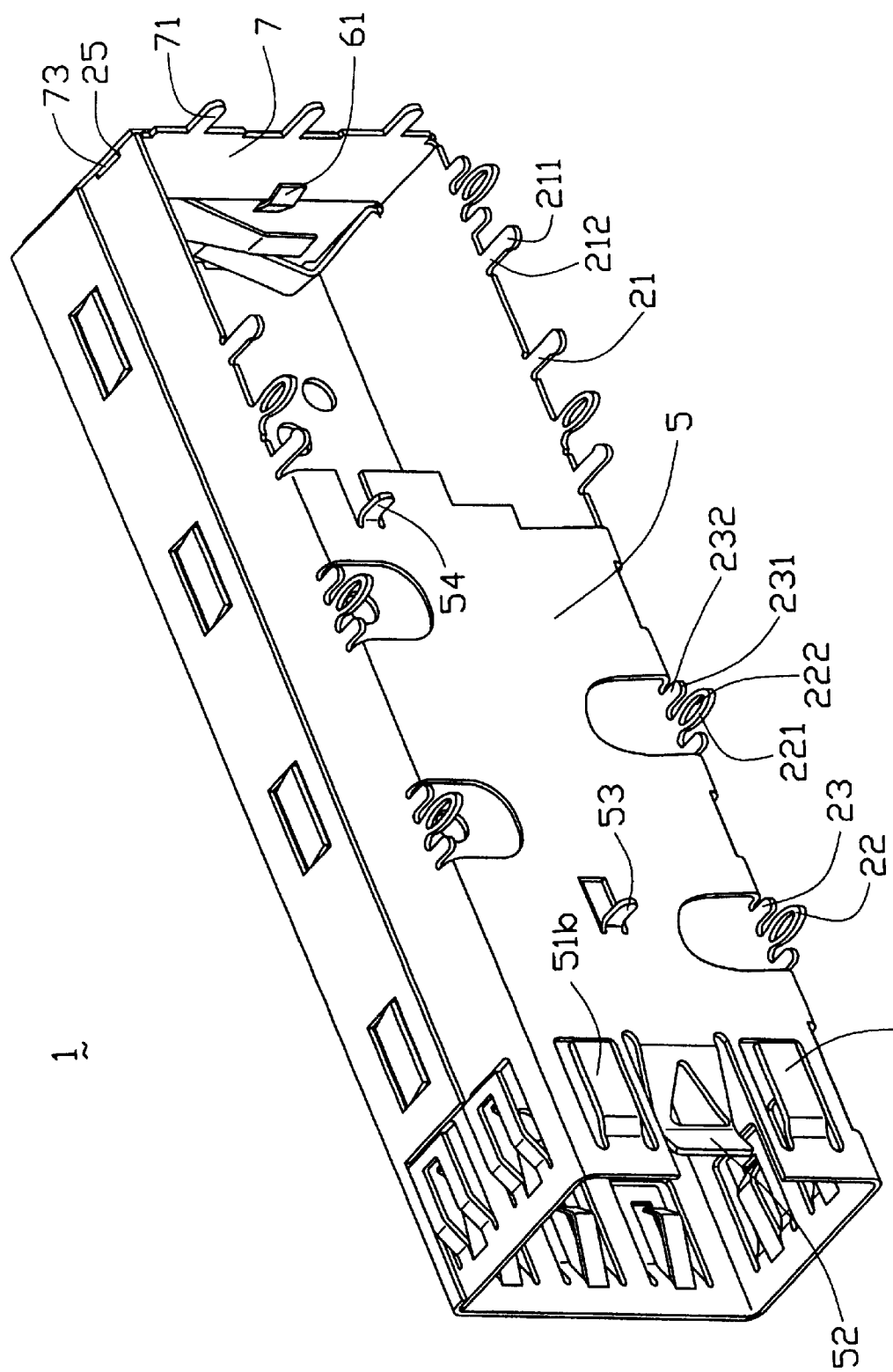
FIG. 5 is similar to FIG. 1, but viewed from a bottom aspect.

Referring particularly to FIG. 5, the compliant legs 21, needle eye legs 22 and support legs 23 are all substantially co-planar with their respective corresponding sidewalls 2a, 2b. Each compliant leg 21 comprises an elongate body 212, and an offset rounded end 211. The offset rounded end 211 is offset such that it slightly extends either toward a front of the cage 1, or toward a rear of the cage 1. Each needle eye leg 22 comprises an elliptical body 221, and an elliptical hole 222 defined in a middle of the elliptical body 221. A width of the elliptical body 221 is dimensioned so that the needle eye leg 22 can press-fit into a corresponding hole defined in a printed circuit board (PCB). Each support leg 23 comprises an elongate body 232, and a rounded end 231.

Referring back to FIGS. 1 and 2, the sidewall cover 3 extends from the top plate 4 and overlaps the first sidewall 2a. A plurality of openings 31 is defined in the sidewall cover 3, for engagingly receiving the clasps 26 of the first sidewall 2a. A plurality of rectangular slots 33 is defined in a junction of the sidewall cover 3 and the top plate 4, for engagingly receiving the locating tabs 27 of the first sidewall 2a. The sidewall cover 3 defines a cutout 34 in a front portion thereof, for accommodating an upper grounding spring tab 24 of the first sidewall 2a.

The top plate 4 forms three grounding spring tabs 41 at a front portion thereof. Each spring tab 41 has an outward grounding portion 411, and an inward grounding portion 412. The outward grounding portion 412 may be formed by stamping the cage 1 outwardly, and the inward grounding portion 412 may be formed by stamping the outward grounding portion 412 inwardly. A plurality of holes 42 is defined in middle and rear portions of the top plate 4.

Figure 4:
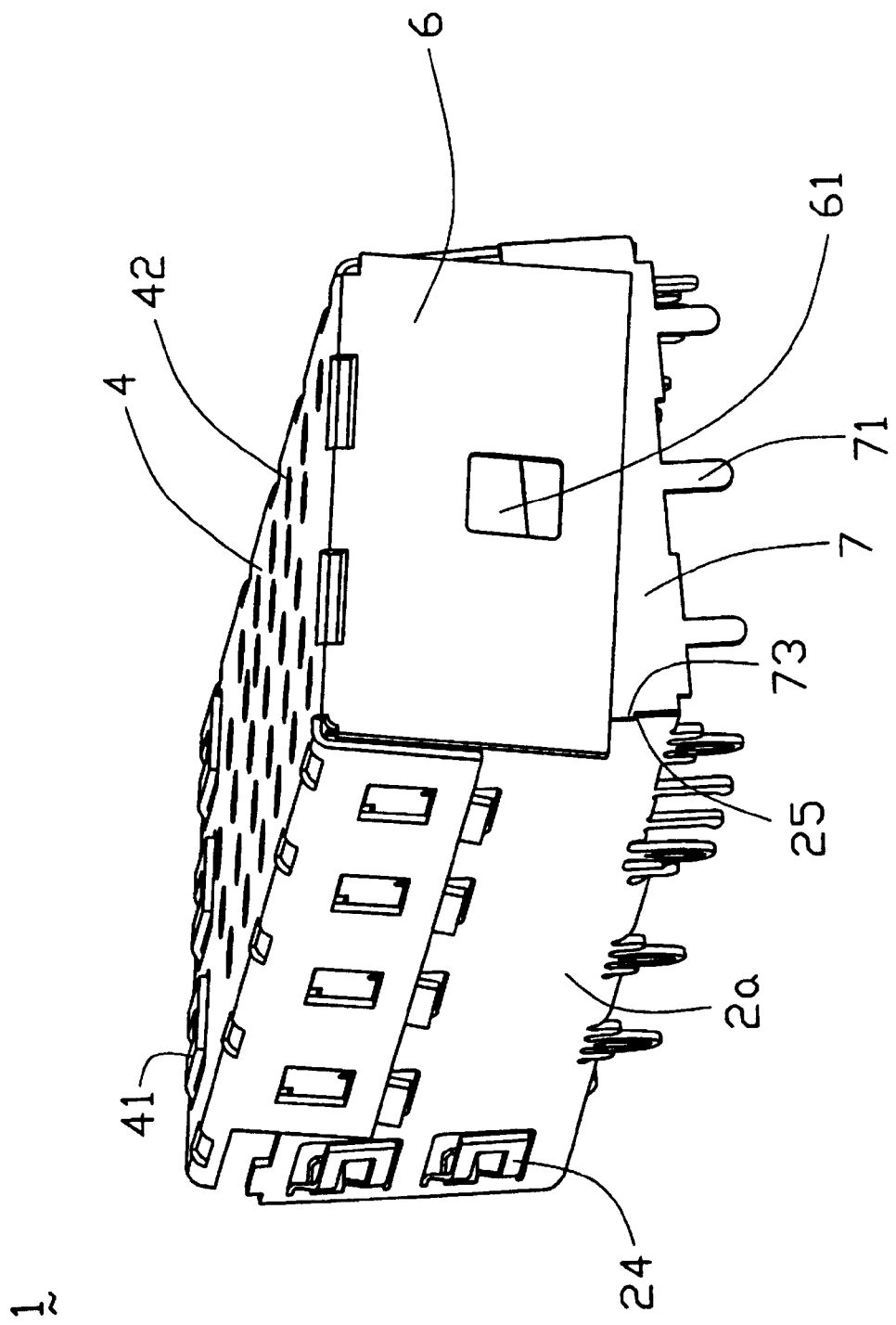
FIG. 4 is similar to FIG. 2, but viewed from a rear aspect.

Referring to FIGS. 3–5, the outer panel 6 of the rear cover extends from the top plate 4. An inward spring tab 61 extends from an inner face of the outer panel 6, for engaging the inner panel 7. The inner panel 7 extends from the second sidewall 2b. A plurality of legs 71 depends from a lower edge of the inner panel 7. A projection 73 is formed at a free end of the inner panel 7, for engaging in the notch 25 of the first sidewall 2a.

The bottom wall 5 is shorter than the top plate 4. A central inward locking tab 52 with a triangular locking opening (not labeled) is formed in a front portion of the bottom wall 5, for latchably engaging with a corresponding SFP module. Two outward grounding spring tabs 51a, 51b are formed in a front portion of the bottom wall 5, on opposite sides of the central tab 52 respectively. A central leg 53 depends from the bottom wall 5 rearward of the central inward tab 52. A rear leg 54 depends from near a rear edge of the bottom wall 5.

In assembly of the cage 1, the projection 73 of the inner panel 7 is engaged in the notch 25 of the first sidewall 2a. The top plate 4 and side cover 3 are bent such that the side cover 3 is fastened over first sidewall 2a. The inward spring tab 61 of the outer panel 6 engages the inner panel 7, thereby fixing the outer panel 6 in place. The clasps 26 of the first sidewall 2a are engaged in the openings 31 of the side cover 3. The locating tabs 27 of the first sidewall 2a are engaged in the rectangular slots 33. The sidewall cover 3 is thereby secured to the first sidewall 2a, forming the cage 1. The spring arms 8a, 8b are located above the inner panel 7. The spring arms 8a, 8b facilitate resilient ejection of an SFP module from the cage 1.

Referring particularly to FIG. 5, in mounting the cage 1 to the PCB, the compliant legs 21 and needle eye legs 22 are extended through corresponding holes defined in the PCB. The offset rounded ends 211 of the compliant legs 21 resiliently press against the PCB at the corresponding holes. The needle eye legs 22 are press-fitted into the corresponding holes of the PCB. The support legs 23 abut a face of the PCB. The central and rear legs 53, 54 of the bottom wall 5 also abut the face of the PCB. The offset rounded ends 211 of the compliant legs 21 and the elliptical bodies 221 of the needle eye legs 22 lock the cage 1 on the PCB. Thus the cage 1 can be firmly and stably secured on the PCB with or without soldering. If the cage 1 is secured on the PCB with soldering, the compliant legs 21 and needle eye legs 22 prevent the cage 1 from moving relative to the PCB during the course of solder reflowing. Furthermore the support legs 23 and central and rear legs 53, 54 serve as standoffs, separating the cage 1 from the PCB to facilitate accurate soldering.

The inward grounding portions 242, 412 respectively of the sidewalls 2a, 2b and top plate 4 project into a central cavity (not labeled) of the cage 1 for contacting an SFP module (not shown) secured therewithin. The outward grounding portions 241, 411 respectively of the sidewalls 2a, 2b and top plate 4 and the outward grounding spring tabs 51a, 51b of the bottom plate 5 project out from the cage 1 for contacting external grounding sources. Thus the spring tabs 24, 41 and outward grounding spring tabs 51a, 51b cooperate to provide multiple grounding paths and prevent electromagnetic interference (EMI).

Figure 6:
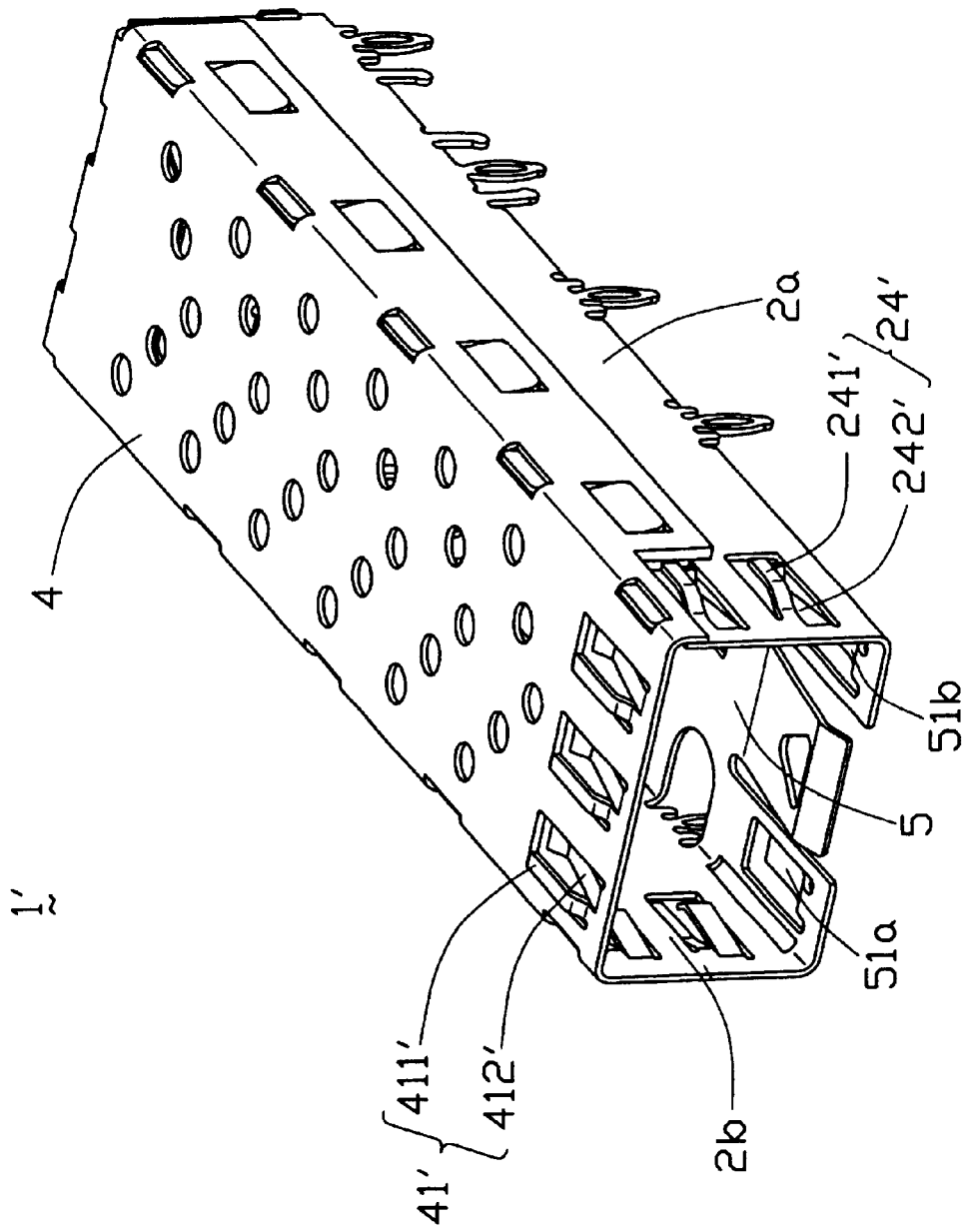
FIG. 6 is a perspective view of an SFP transceiver cage in accordance with an alternative embodiment of the present invention.

Referring to FIG. 6, an SFP transceiver cage 1' in accordance with an alternative embodiment of the present invention has a structure similar to that of the cage 1 of the preferred embodiment. The cage 1' is preferably made of metal. The cage 1' comprises spring tabs 24', 41'. Each spring tab 24' has an outward grounding portion 241', and an inward grounding portion 242'. Each spring tab 41' has an outward grounding portion 411', and an inward grounding portion 412'. The outward and inward grounding portions 411', 412' may be formed by stamping the cage 1' respectively inwardly and outwardly. The outward grounding portions 241', 411' project out from the cage 1'. The inward grounding portions 242', 412' project into the cage 1'. Thus the spring tabs 24', 41' and the outward grounding spring tabs 51a, 51b of the bottom plate 5 cooperate to provide multiple grounding paths and prevent EMI.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A small form-factor pluggable transceiver cage made from a single piece of metal plate, the cage comprising:
    a top plate;
    a bottom wall;
    a rear cover;
    two sidewalls;
    a sidewall cover; and
    a plurality of spring tabs formed on the cage, at least one of the spring tabs having an inward grounding portion and an outward grounding portion, the inward and outward grounding portions respectively projecting into and out from the cage.

2. The cage as described in claim 1, wherein the outward grounding portion is formed by stamping the cage outwardly, and the inward grounding portion is formed by stamping the outward grounding portion inwardly.

3. The cage as described in claim 1, wherein the inward and outward grounding portions are formed by stamping the cage respectively inwardly and outwardly.

4. The cage as described in claim 1, wherein the spring tabs are formed on the front portion of the top plate and on front portions of the sidewalls.

5. The cage as described in claim 1, wherein the inward grounding portion of the at least one of the spring tabs projects into a cavity of the cage for contacting a corresponding small form-factor pluggable module, thereby providing at least one grounding paths and preventing EMI.

6. The cage as described in claim 1, wherein the spring tabs are adjacent an entrance of the cage.

7. A small form-factor pluggable transceiver cage comprising:

a top plate forming a plurality of spring tabs, each of the spring tabs having an inward grounding portion and an outward grounding portion, the inward and an outward grounding portions respectively extending into and out from the cage;

a bottom wall;

first and second parallel sidewalls positioned between the top plate and the bottom wall, the first sidewall integrally connected to the bottom wall, the second sidewall integrally connected to both the bottom wall and the top plate;

a sidewall cover depending from one edge of the top plate and at least partially overlapping the first sidewall; and a rear cover including inner and outer panels, the inner panel extending from a rear edge of one of the first and second sidewalls toward the other of the first and second sidewalls.

8. The cage as described in claim 7, wherein outward grounding portion is formed by stamping the cage outwardly, and the inward grounding portion is formed by stamping the outward grounding portion inwardly.

9. The cage as described in claim 7, wherein the cage is made from a single piece of metal plate.

10. The cage as described in claim 7, wherein the inward and outward grounding portions are formed by stamping the cage respectively inwardly and outwardly.

11. The cage as described in claim 7, wherein the sidewalls further include a plurality of spring tabs, at least one of the spring tabs of the sidewalls has an inward grounding portion and an outward grounding portion, the inward and the outward grounding portions of the sidewalls respectively extending into and out from the cage.

12. The cage as described in claim 11, wherein the outward grounding portion of the at least one of the spring tabs of the sidewalls is formed by stamping the cage outwardly, and the inward grounding portion of the at least one of the spring tabs of the sidewalls is formed by stamping the outward grounding portion inwardly.

13. The cage as described in claim 11, wherein the inward and outward grounding portions of the at least one of the spring tabs of the sidewalls are formed by stamping the cage respectively inwardly and outwardly.

14. A one piece cage for use with a panel and an optical device, comprising: a top plate; a bottom wall opposite to said top plate; two opposite sidewalls between said top plate and said bottom wall; a sidewall cover depending from one edge of the top plate and at least partially overlapping the first sidewall; said top plate, said bottom wall and said two side walls commonly defining a space for receiving the optical device therein along a longitudinal direction thereof; a locking tab upwardly extending around a front portion of the bottom wall for locking with the optical device; and a plurality of grounding spring tabs formed around front portions of the top plate and two sidewalls laterally aligned with said locking tab; wherein each of said grounding spring tabs includes an outward grounding portion and an inward grounding portion laterally offset from each other for mechanically and electrically engaging the panel outside and the optical device inside, respectively.

* * * * *